June 3, 1969 R. O. RHEAUME 3,448,394

OVERLOAD PROTECTION FOR AMPLIFIERS

Filed June 13, 1966

INVENTOR:

ROLAND O. RHEAUME

By MASON, KOLEHMAINEN,
RATHBURN & WYSS

United States Patent Office 3,448,394
Patented June 3, 1969

3,448,394

OVERLOAD PROTECTION FOR AMPLIFIERS

Roland O. Rheaume, Racine, Wis., assignor to Webster Electric Company, Inc., Racine, Wis., a corporation of Delaware Filed June 13, 1966, Ser. No. 557,312
Int. Cl. H03f *3/04, 3/26, 17/00*
U.S. Cl. 330—11 7 Claims

ABSTRACT OF THE DISCLOSURE

The push-pull transistor output stage of an amplifier is protected against overload by a circuit responsive to the transistor output signals. Detecting elements connected to each transistor develop a signal proportional to the output signal of the corresponding transistor. A third transistor is connected in common to the detecting elements and is rendered conductive if an overload condition exists to gate an SCR thereby to short circuit the operating bias of a preamplifier stage. A manual switch in the SCR current path is opened to return the circuit to its original condition. Alternatively a switch responsive to energization of a lamp in circuit with the SCR may be used automatically to interrupt current flow.

Figure 1:
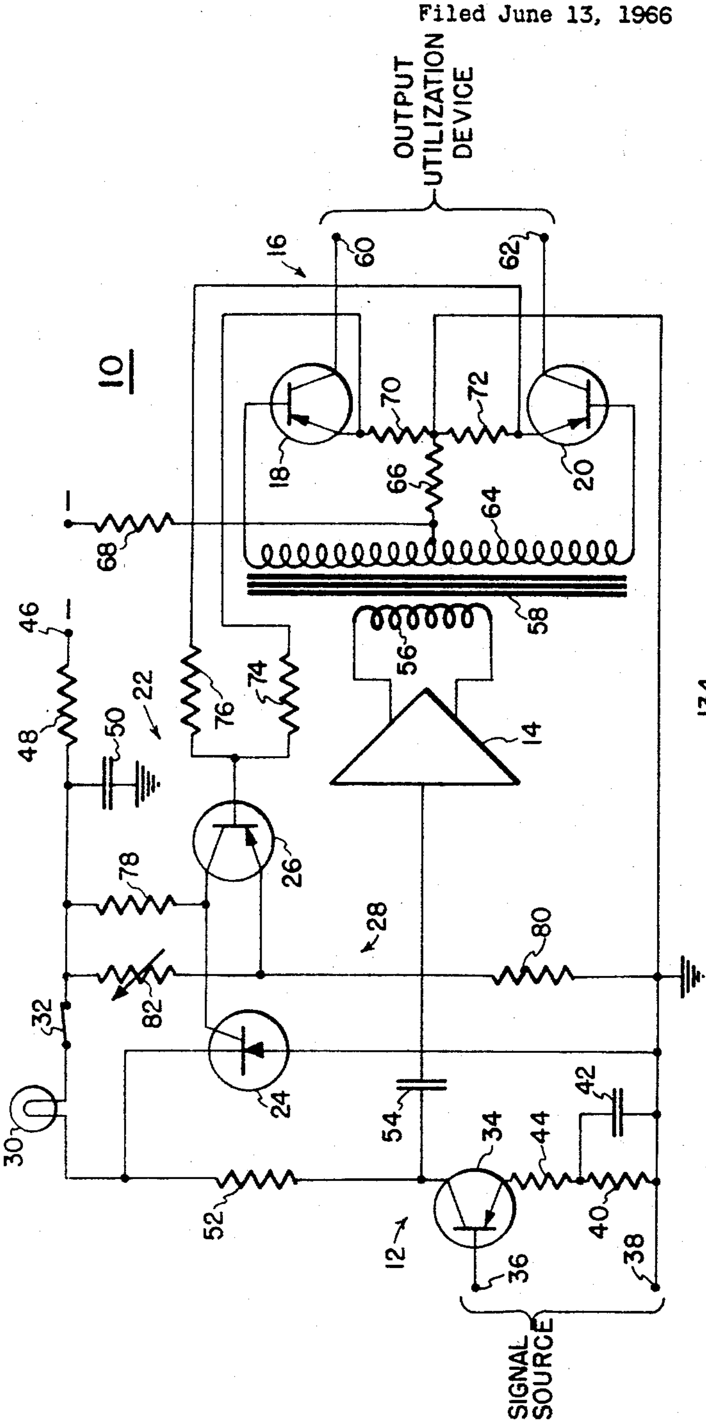

The present invention relates to overload protection for amplifiers, and has for an object the provision of an improved amplifier including a novel arrangement for preventing overload damage to the output stage.

One problem that exists in connection with amplifiers is that the output stage can be damaged by excessive current flow, such as might be caused by an excessive driving signal, or by a short circuited output. This problem is particularly troublesome in transistor amplifiers, where transistors are used in the output stage. In an attempt to overcome this problem, fuses are used in the output stages of many known amplifiers. However, output transistors can be damaged by current surges of very short duration, and fuses do not act quickly enough to protect the circuit. Another approach to the problem is to provide a regulated power supply for limiting the power available to the output transistors, thereby limiting the current. Such an arrangement however is unduly expensive and not always reliable. Another proposal which has been made is to provide an arrangement for detecting the current flow in an output transistor and for interrupting driving signal to the transistor when an overload condition exists. Although arrangements of this type can be fast acting, they suffer from several disadvantages, one being that they are complex, and therefore expensive, especially when several transistors are protected. Another disadvantage is that known arrangements must be designed in connection with the specific amplifier with which they are to be used, because they affect and are affected by the gain and other characteristics of the amplifier.

Accordingly, it is an object of the present invention to provide an improved overload protected amplifier, including a novel overload protection arrangement capable of overcoming the above and other disadvantages of known arrangements.

Another object is to provide an overload protected amplifier capable of reacting very quickly to protect effectively against instantaneous current surges.

A further object of the invention is to provide an overload protected amplifier of simple and economic construction.

Yet another object of the invention is to provide an arrangement capable of protecting any desired number of amplifying devices, such as transistors, without significant duplication or multiplication of parts.

Still a further object of the invention is to provide an overload protected amplifier wherein the overload protection circuitry operates largely independently of the amplifier, and can thus be readily adapted for use with different amplifiers.

Another object of the invention is to provide novel arrangements for returning the amplifier to the initial operating condition following an overload condition.

In accordance with these and other objects of the invention, an embodiment of the invention may comprise an amplifier including an output stage having a plurality of amplifying devices, which may be transistors. In accordance with a feature of the invention, detecting means are associated with the output circuit of each amplifying device for detecting the output signal level, and a single controlled conduction devices has an input coupled to each of the detecting devices. A control circuit is coupled between the single controlled conduction device and the amplifying devices for operating the amplifying devices at a reduced output level when an overload condition is sensed in any one of the amplifying devices. Thus there is provided a fast acting, simple and economical arrangement wherein a single controlled conduction device senses an overload condition in any one of a plurality of amplifying devices.

The single controlled conduction device is biased by a biasing circuit substantially independent of the remainder of the amplifier, and as a result, the operation of the overload protection circuit is not affected by the amplifier gain or other characteristics. Accordingly, the overload protection circuit can readily be adapted for use with different amplifiers.

The amplifier includes a preamplifier stage providing operating signals for the output stage, and a controlled rectifier, such as a gated rectifier, is connected to short circuit the preamplifier stage when an overload is detected, thus discontinuing the operating signal to the output stage. An indicator lamp is connected to provide an indication of the operative condition of the amplifier, and a reset switch is included in order to sever the current path through the controlled rectifier thereby to return the amplifier to its initial operating condition following an overload. This may be done manually, or, as described in connection with an alternative embodiment of the present invention, this may be done automatically by means of a novel reset arrangement including bimetal controlled contacts opened by heat from the indicator lamp.

Figure 2:
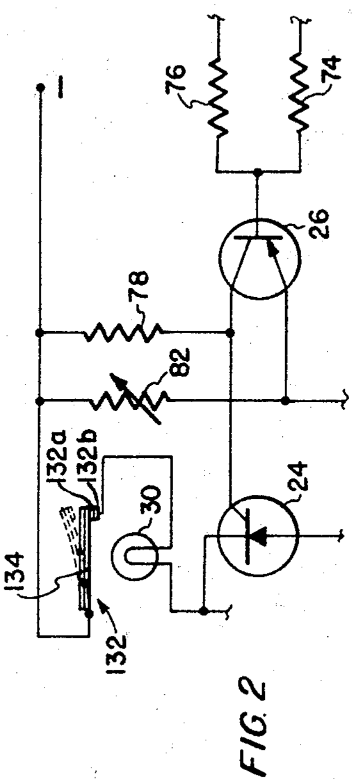

The above and other objects and advantages of the present invention will become apparent from the ensuing description of illustrative embodiments of the invention, in the course of which reference is had to the accompanying drawing, in which:

FIG. 1 is a schematic diagram illustrating an overload protected amplifier constructed in accordance with the principles of the present invention; and FIG. 2 is a schematic diagram of a portion of an overload protected amplifier comprising an alternative embodiment of the invention.

Referring now to the drawing, and initially to FIG. 1, there is illustrated a novel overload protected amplifier generally designated as 10. The amplifier 10 includes a preamplifier stage generally designated as 12 adapted to receive signals from a suitable signal source. A driver stage 14, illustrated diagrammatically in the drawing, receives preamplified signals from the preamplifier stage 12 and provides driving signals to an output stage generally designated as 16. The output stage 16 includes a pair of transistors 18 and 20 arranged in push pull configuration for supplying output signals to a suitable output utilization device.

In order to protect the transistors 18 and 20 of the output stage 16 from damage or destruction which might otherwise be caused by excess current flow through the transistors due to an excessive driving signal or to a short circuited output, there is provided a novel overload protection circuit generally designated as 22. This circuit includes a short circuiting element 24 connected across the preamplifier stage 12 for interrupting the operating signals to the output stage when an overload condition exists in the output stage. In accordance with a feature of the invention, the operation of the short circulating element 24 is controlled by means of a single controlled conduction device 26 which in turn is controlled by the output signal in the transistors 18 and 20 in such a manner that when an overload condition exists in any one of the output transistors, the operating signal for the output stage is quickly discontinued.

The operating bias for the single controlled conduction device 26 is provided by means of a biasing circuit, generally designated as 28, connected between the power supply terminals of the amplifier and therefore operating essentially independently of amplifier gain or other characteristics.

When an overload condition exists in the output circuit of either of the output transistors 18 or 20, the single controlled conduction device 26 operates the short circuiting element 24 to short circuit the preamplifier stage 12 and thereby discontinue operating signals to the output stage. An indicator lamp 30 is included in order to provide an indication of the operative condition of the amplifier, and a reset switch 32 serves to sever the current path through the short circuiting element 24 thereby to return the amplifier to its initial operative condition.

More specifically, the preamplifier stage 12 of the amplifier 10 includes a preamplifier transistor 34 with base and emitter electrodes coupled to a pair of input terminals 36 and 38. The terminals 36 and 38 are adapted to be connected to a source of signals to be amplified by the amplifier 10. Terminal 38 is connected to a point of reference potential, and is coupled to the emitter of transistor 34 through a filter including a resistor 40 and capacitor 42 in series with a biasing resistor 44.

A supply terminal 46 is adapted to be connected to a point of operating potential, negative with respect to the reference potential in the illustrated embodiment of the invention. An operating bias is applied to the collector electrode of the preamplifier transistor 34 through a circuit including a filter comprising a resistor 48 and a capacitor 50, and a current limiting resistor 52.

An indication of the normal condition of operation of the amplifier 10 is provided by the lamp 30. In the normal condition of operation, a relatively small current flows through the emitter-collector circuit of transistor 34 because of the resistors 52 and 44 as well as the internal transistor impedance. Thus, normally the indicator lamp 30 is not lighted by this small current. The lamp 30 is preferably located in a visible position, and absence of visible light provides an indication that the amplifier is functioning properly.

As noted above, input signals received at the base electrode of the transistor 34 are preamplified, and the preamplified signals are forwarded to the driver stage 14 through a coupling capacitor 54. The driving stage 14 is illustrated only in diagrammatic form, and it should be understood that the driving stage may include any suitable arrangement of devices for amplifying the preamplified signals and developing a driving signal for the output stage, together with conventional circuitry for providing an operating bias. The output of the driving stage is connected to a primary winding 56 of a coupling transformer 58 serving to forward driving signals to the output stage.

Driving signals from the driving stage 14 operate the output stage 30 so that the output transistors 18 and 20 supply output signals through a pair of amplifier output terminals 60 and 62 to an output utilization device. The two output transistors 18 and 20 are arranged in push pull configuration, and each includes a base and an emitter electrode coupled to one half of a center tapped secondary winding 64 of the coupling transformer 58. The output transistors 18 and 20 are provided with a small forward bias for class AB operation by the potential drop across a resistor 66, connected in series with resistor 68 across the supply voltage. The emitters of transistors 18 and 20 are coupled to the relatively positive point of reference potential through a pair of resistors 70 and 72, while the collectors are connected to the pair of output terminals 60 and 62 which are adapted to be connected to a load or output utilization device, through which the output circuits of the transistors 18 and 20 are completed.

In the normal operating condition of the amplifier 10, the output signals from the amplifier comprise currents flowing through the emitter-collector circuits, or output circuits, of the output transistors 18 and 20. Amplifying devices may be damaged by excessive current flow, and when transistors are used in the output stage, the transistors may be destroyed by substantially instantaneous current surges or peaks. Such excessive and damaging currents may be caused by excessive driving signals forwarded from the driving stage, or by a short circuited output.

In accordance with a feature of the present invention, there is provided a novel, fast acting and simple arrangement for preventing damage to the output transistors which might otherwise result from excessive currents. This arrangement includes the single controlled conduction device 26, the input of which is coupled to an output level detecting element in the output circuit of each of the protected transistors—i.e., each of the output transistors 18 and 20. Although the single controlled conduction device 26 is illustrated as a transistor, it should be understood that any other type of device could be used.

In order independently to detect the output signal level in each of the output transistors 18 and 20, the resistors 70 and 72 are used, each being coupled to the base electrode of the transistor 26 through one of a pair of resistors 74 and 76. The resistor 70 is in series with the emitter and collector of the output transistor 18, and thus serves to forward a signal to the base of the transistor 26 the magnitude of which is proportional to the level of current flowing through the output transistor 18. The resistor 72 performs an identical function in connection with the output transistor 20. Furthermore, it will be appreciated that in the illustrated push pull configuration of the output stage 16, the transistors 18 and 20 conduct substantially alternately. Thus, the detected signals responsive to the output levels of the two output transistor 18 and 20 are forwarded in an alternating sequence to the base of the transistor 26.

The transistor 26 is normally held in a non-conductive condition by the biasing circuit 28, but when a predetermined current level, or overload condition, is detected in either one of the output transistors 18 and 20, the signal detected by either the resistor 70 or the resistor 72 places the transistor 26 in a conductive condition. When this occurs, means including the controlled rectified 24 immediately reduces the output level in the output stage.

In accordance with a feature of the invention, the biasing circuit 28 is substantially independent of amplifier gain and other parameters, since it is connected directly across the power supply. Because of this feature, the protection arrangement of the present invention may readily be adapted to many different amplifiers. The bias circuit 28 includes a limiting resistor 78 coupled to the collector of the transistor 26, and a voltage dividing circuit including a resistor 80 and an adjustable resistor 82 for providing a bias potential to the emitter. The predetermined output current level at which the transistor 26 is placed in a conductive condition may be adjusted to any desired safe level by adjustment of the variable resistance 82.

The short circuiting element 24, illustrated as comprising a silicon controlled rectifier, is normally in a non-conductive or blocking condition. When the transistor 26 is placed in a conductive condition, a relatively positive gating signal is applied to the gate electrode of the rectifier 24, placing the rectifier in a conductive, short circuiting state. The rectifier 26 is arranged to short circuit the preamplifier stage 12, and accordingly, when an overload condition is detected, the operating signals to the output stage are immediately interrupted. Furthermore, the operating signals are discontinued indefinitely until such time as the short circuit current path through the rectifier 24 is severed, and the cessation of output signals serves to return the transistor 26 to its initial non-conductive condition.

When an overload is detected, and the preamplifier stage 12 is short circuited, increased current flows through the indicator lamp 30, since the rectifier, after being gated, acts substantially as a closed circuit removing the resistances 52 and 44 from the circuit. The lamp 30 accordingly lights and provides an indication that an overload has occurred, and that the amplifier 10 is no longer in its initial operating condition.

In order to return the amplifier to its operating condition after an overload, the reset switch 32 is opened, and then reclosed. This severs the current path through the controlled rectifier 24 and returns it to its original blocking condition, and the amplifier 10 returns to its initial operating condition.

Having reference now to FIG. 2, there is illustrated an alternative embodiment of the invention. FIG. 2 comprises a schematic diagram of some portions of an amplifier circuit similar in many respects to the amplifier 10 and the portions of the circuit illustrated in FIG. 2 which are identical to apparatus described previously in connection with the embodiment of FIG. 1 are designed by identical reference numerals.

In accordance with a further feature of the present invention, and as illustrated in FIG. 2, the amplifier may be provided with means for automatically returning the amplifier to its initial operating condition after an overload. Thus there is provided a reset switch 132, including a pair of normally closed contacts **132*a* and 132*b* controlled by a heat responsive bimetal element 134. In the normal condition of the operation of the amplifier, the contacts 132*a* and 132*b* are closed, and the indicator lamp 30 is not lighted. When an overload condition is detected in the output stage, the circuit illustrated in part in FIG. 2 functions as does the circuit illustrated in FIG. 1 to short circuit the preamplifier stage (not illustrated in FIG. 2). When the controlled rectifier 24 is rendered conductive, the current flow to the lamp 30 is increased sufficiently to light the lamp 30**.

The reset switch 132 is located adjacent lamp 30 so that heat generated by energization of the lamp 30 causes the bimetal element 134 to be heated and to flex, thus causing the contacts **132*a* and 132*b* to open after a period of time, as illustrated in dotted lines in FIG. 2. When the contacts 132*a* and 132*b* open, the current path through the controlled rectifier 24 is severed and the lamp 30 is de-energized. Accordingly, after a period of time, the bimetal element 134 cools and the contacts 132*a* and 132*b*** close once more and the circuit is returned automatically to its initial condition.

While the present invention has been described in connection with the details of specific embodiments thereof, it should be understood that numerous other modifications and embodiments can be devised by those skilled in the art that will fall within the spirit and scope of the invention.

What is claimed as new and desired to be secured by Letters Patent in the United States is:

1. An overload protected amplifier comprising an output stage including a pair of transistors connected in push-pull relation, each said transistor including a control junction and a pair of output electrodes, a preamplifier coupled to said control junctions for applying an operating signal to said output stage, biasing means connected to said preamplifier for applying an operating bias to said preamplifier, a pair of signal detecting elements each connected in series with said output electrodes of one of said transistors for developing a control signal having a magnitude varying in accordance with the corresponding transistor output signal, a controlled conduction device having an output electrode and a control electrode, means coupling said control electrode in common to both said signal detecting means for altering the conductivity level of said controlled conduction device in response to a predetermined output signal level, and a switching device connected to said preamplifier biasing means, said switching device being switchable to two states for alternatively enabling and disabling said preamplifier biasing means, said switching device including a control terminal coupled to said output electrode of said controlled conduction device for switching said switching device to said disabling state in response to said predetermined transistor output signal level.

2. An overload protected amplifier as claimed in claim 1 wherein said switching device comprises a normally non-conductive element connected across said preamplifier biasing means and adapted to be placed in a conductive condition in response to said predetermined output signal.

3. An overload protected amplifier as claimed in claim 2 wherein said element comprises a silicon controlled rectifier.

4. An overload protected amplifier as claimed in claim 3 further comprising a reset switch in series with said controlled rectifier for severing the current path through the rectifier thereby to return the rectifier to its non-conductive condition.

5. An overload protected amplifier as claimed in claim 4 further comprising an indicating lamp connected in circuit with said rectifier and adapted to be energized in the conductive condition of said rectifier.

6. The overload protected amplifier of claim 5, said reset switch comprising a manually operated switch.

7. The overload protected amplifier of claim 5, said reset switch comprising a fixed contact, a bimetal element, and a movable contact supported by said bimetal element and normally engaging said fixed contact, said bimetal element being disposed in heat transfer relationship with said lamp for moving said movable contact away from said fixed contact in response to energization of said lamp.

References Cited

UNITED STATES PATENTS

| | | | |
|---|---|---|---|
| 2,585,890 | 2/1952 | Wolfe | 330—134 |
| 2,910,550 | 10/1959 | Soffel | 330—139 |
| 2,918,630 | 12/1959 | Kiebert | 330—139 X |
| 3,102,241 | 8/1963 | Johnstone | 330—22 |

NATHAN KAUFMAN, *Primary Examiner.*

U.S. Cl. X.R.

307—202; 330—12, 59